United States Patent
Chen et al.

(10) Patent No.: US 11,482,641 B2
(45) Date of Patent: Oct. 25, 2022

(54) ELECTRONIC DEVICE AND METHOD FOR MANUFACTURING THE SAME

(71) Applicant: InnoLux Corporation, Miao-Li County (TW)

(72) Inventors: Jia-Yuan Chen, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 86 days.

(21) Appl. No.: 17/068,842

(22) Filed: Oct. 13, 2020

(65) Prior Publication Data

US 2021/0043800 A1 Feb. 11, 2021

Related U.S. Application Data

(63) Continuation of application No. 16/190,174, filed on Nov. 14, 2018, now Pat. No. 10,840,407.

(51) Int. Cl.
*H01L 33/00* (2010.01)
*H01L 25/13* (2006.01)
*H01L 21/66* (2006.01)

(52) U.S. Cl.
CPC .......... *H01L 33/0095* (2013.01); *H01L 22/24* (2013.01); *H01L 25/13* (2013.01); *H01L 2933/0066* (2013.01)

(58) Field of Classification Search
CPC ......... H01L 22/10; H01L 22/12; H01L 22/14; H01L 22/20; H01L 22/22; H01L 22/26; H01L 22/30; H01L 22/34; H01L 23/12; H01L 23/14; H01L 23/58; H01L 23/585; H01L 24/01; H01L 24/10; H01L 24/11; H01L 24/12; H01L 24/15; H01L 24/81; H01L 24/90; H01L 25/04; H01L 25/13; H01L 25/167; H01L 25/50; H01L 33/0095; H01L 2933/0066; H01L 22/24; H01L 33/62
See application file for complete search history.

(56) References Cited

U.S. PATENT DOCUMENTS

2017/0084561 A1* 3/2017 Seo .................. H01L 24/11
2018/0254226 A1* 9/2018 Iguchi .............. H01L 27/156

FOREIGN PATENT DOCUMENTS

CN 207474492 U 6/2018
CN 108735872 A 11/2018

* cited by examiner

*Primary Examiner* — Cheung Lee
(74) *Attorney, Agent, or Firm* — Winston Hsu

(57) ABSTRACT

A method for manufacturing an electronic device includes providing a substrate, forming a plurality of connecting pads and a plurality of conductive portions partially overlapped by the plurality of connecting pads on a surface of the substrate; forming a plurality of conductive lines on the substrate, wherein the plurality of conductive lines are electrically connected to the plurality of conductive portions; and bonding a plurality of light emitting units to the plurality of connecting pads. The method may further includes identifying a defective light emitting unit from the plurality of light emitting units; removing the defective light emitting unit from a corresponding position on the substrate; and bonding another light emitting unit to the corresponding position.

17 Claims, 13 Drawing Sheets

ELECTRONIC DEVICE AND METHOD FOR MANUFACTURING THE SAME

CROSS REFERENCE TO RELATED APPLICATIONS

This application is a continuation of U.S. application Ser. No. 16/190,174, filed on Nov. 14, 2018, the disclosure of which is incorporated by reference herein.

BACKGROUND OF THE DISCLOSURE

1. Field of the Disclosure

The present disclosure is related to an electronic device and related manufacturing method, and more particularly, to an electronic device with a repairing light emitting unit and related manufacturing method.

2. Description of the Prior Art

Nowadays, display devices have advantages of portability, low power consumption, and low radiation. Therefore, they are widely used in various electronic devices, such as desktop computers, notebooks, smart phones, car displays and head up displays. In addition, self-luminous light emitting elements are applied to display devices for providing light source or displaying images. When disposing the self-luminous light emitting elements in the display device, some defective light emitting elements may be detected. Therefore, it is an important issue for the manufacturers to improve the repair technique of the light emitting elements, so as to increase the fabrication yield.

SUMMARY OF THE DISCLOSURE

One of the objectives of the present disclosure is to provide an electronic device and related manufacturing method, wherein a repairing technique of light emitting units is introduced.

A method for manufacturing an electronic device includes providing a substrate, forming a plurality of connecting pads and a plurality of conductive portions partially overlapped by the plurality of connecting pads on a surface of the substrate; forming a plurality of conductive lines on the substrate, wherein the plurality of conductive lines are electrically connected to the plurality of conductive portions; bonding a plurality of light emitting units to the plurality of connecting pads; identifying a defective light emitting unit from the plurality of light emitting units; removing the defective light emitting unit from a corresponding position on the substrate; and bonding another light emitting unit to the corresponding position.

A method for manufacturing an electronic device includes providing a substrate; forming a plurality of connecting pads and a plurality of conductive portions partially overlapped by the plurality of connecting pads on a surface of the substrate; forming a plurality of conductive lines on the substrate, wherein the plurality of conductive lines are electrically connected to the plurality of conductive portions; and bonding a plurality of light emitting units to the plurality of connecting pads.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
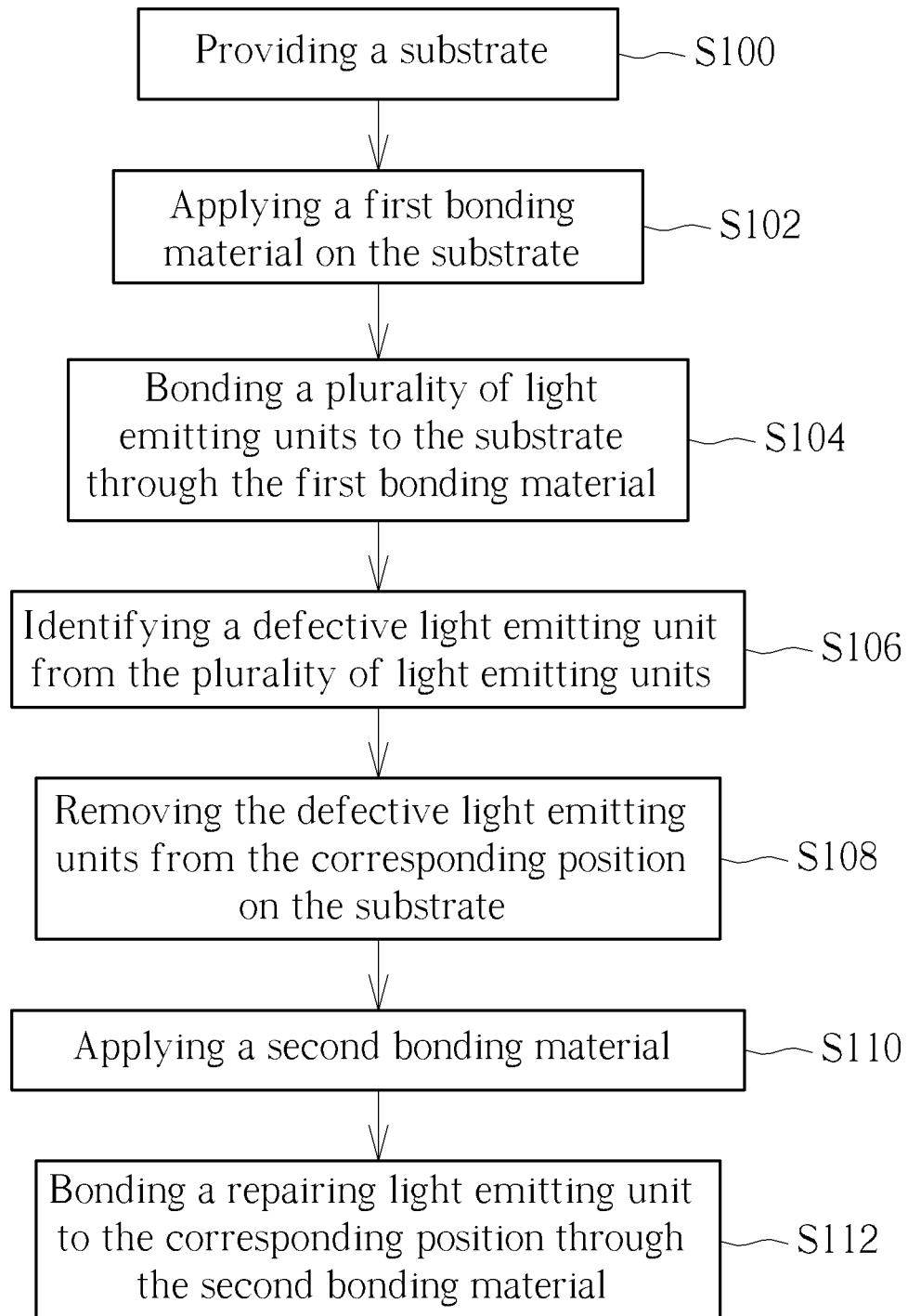
FIG. 1 is a process flowchart of a method for manufacturing an electronic device according to a first embodiment of the present disclosure.
Figure 2:
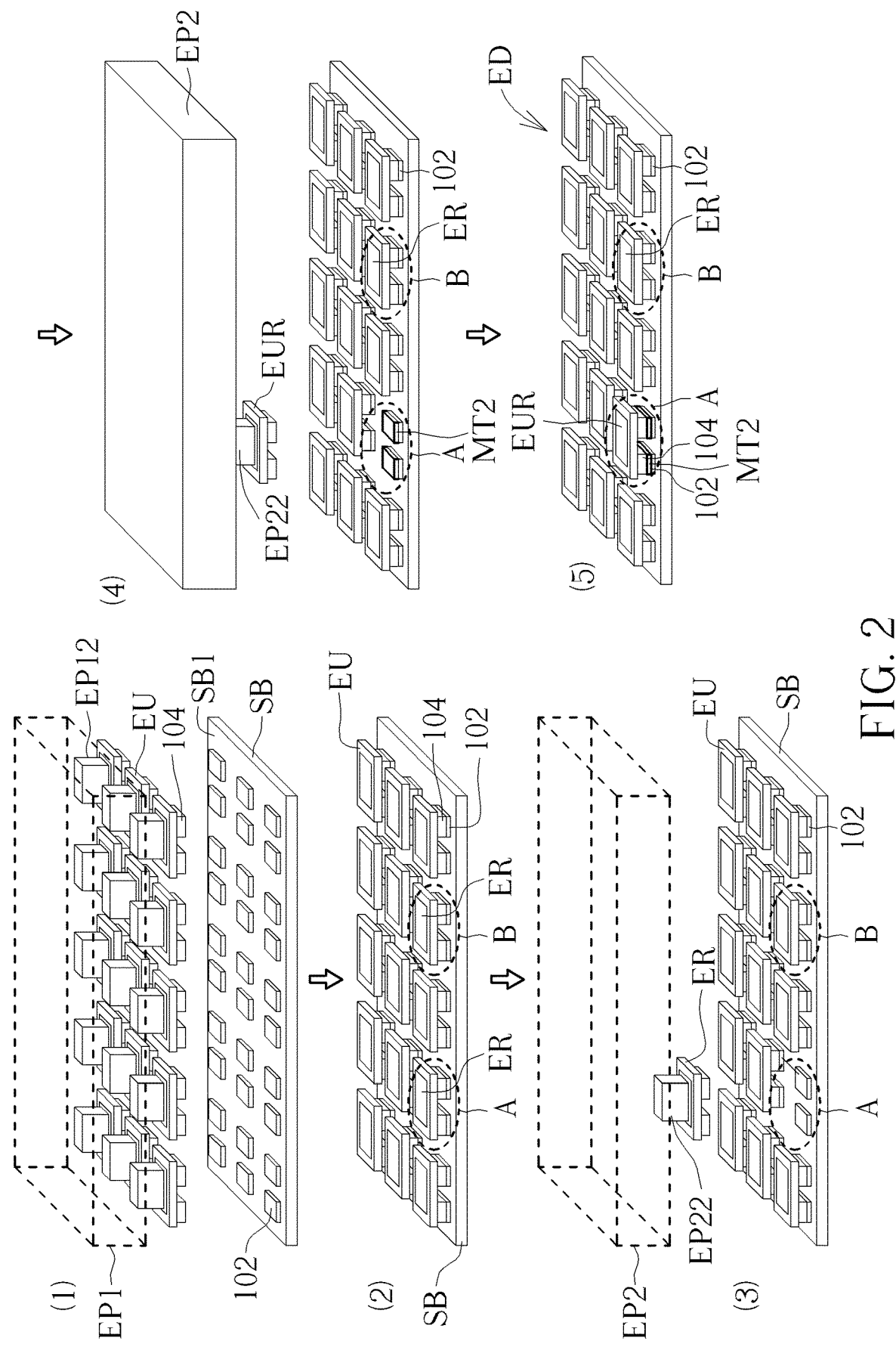
FIG. 2 is a schematic diagram illustrating the manufacturing processes and related equipment and devices of the method for manufacturing an electronic device according to the first embodiment of the present disclosure.
Figure 3:
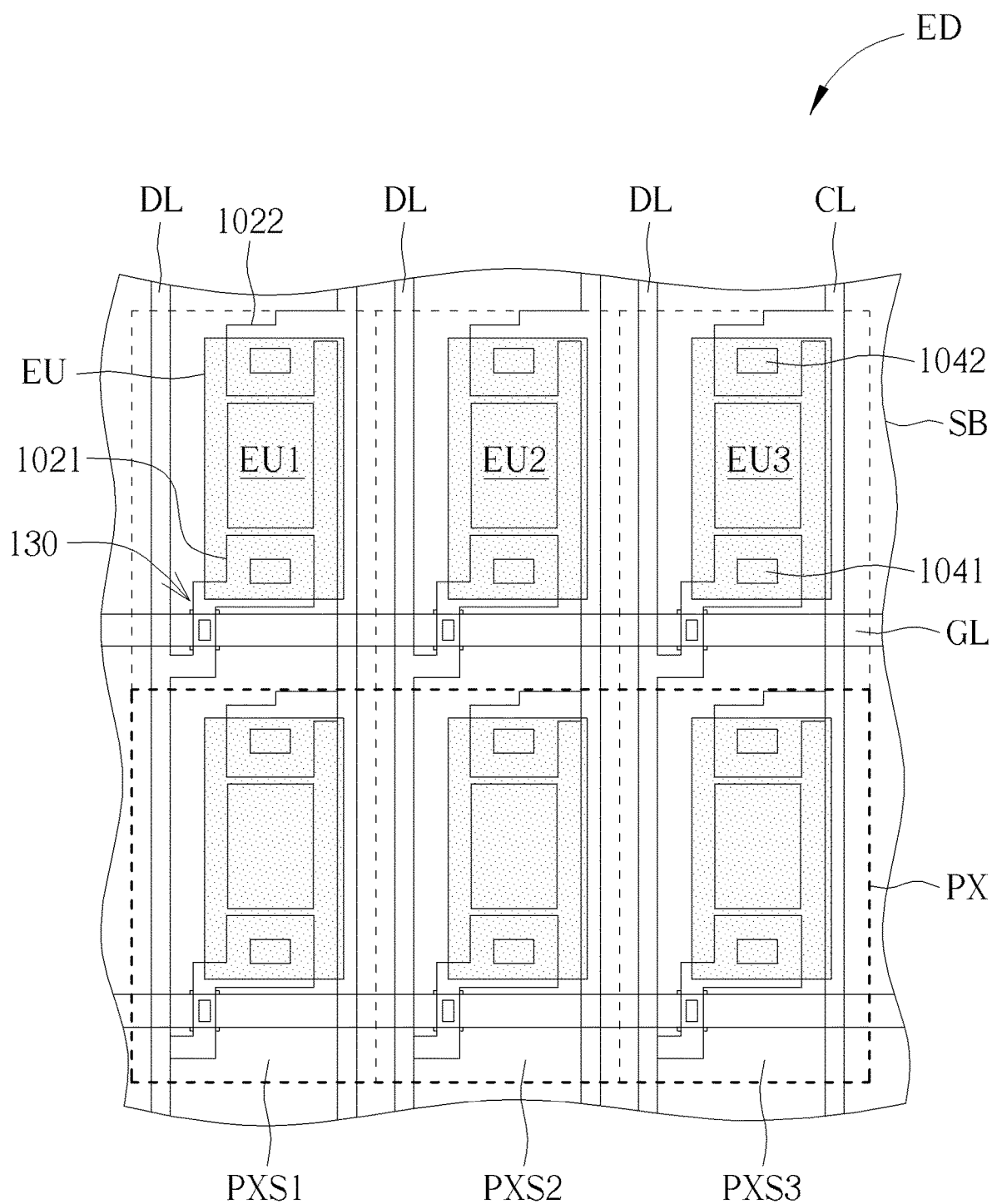
FIG. 3 is a schematic diagram of a partial enlargement of the substrate shown in FIG. 2.
Figure 4:
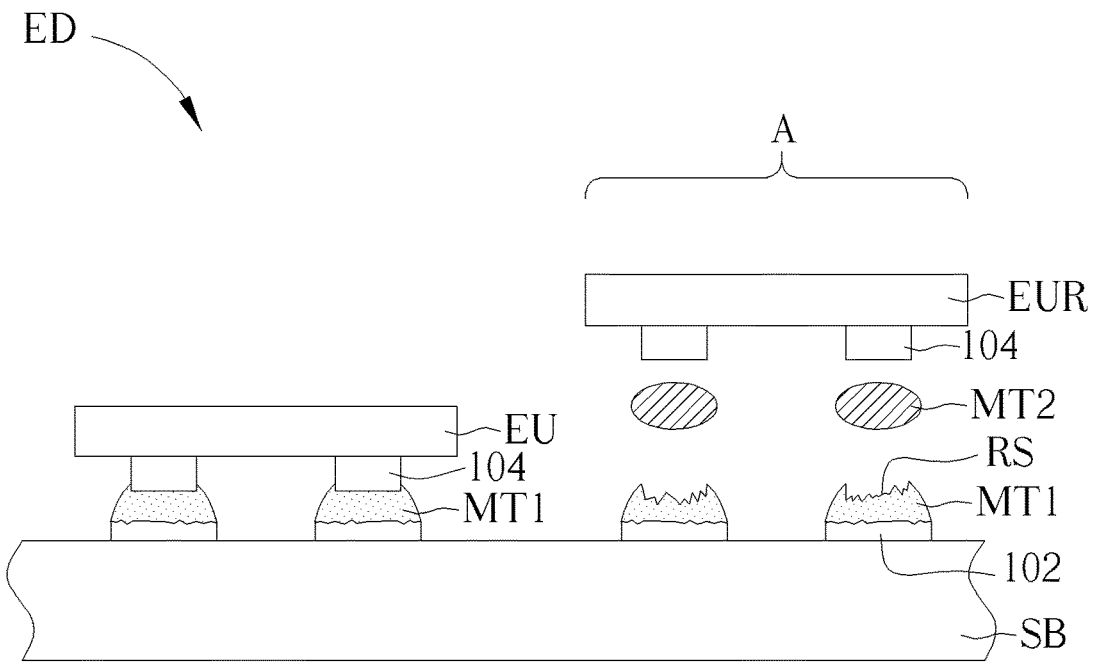
FIG. 4 to FIG. 5 are schematic diagrams of sectional views showing manufacturing processes of the method for manufacturing the electronic device according to the first embodiment of the present disclosure.
Figure 5:
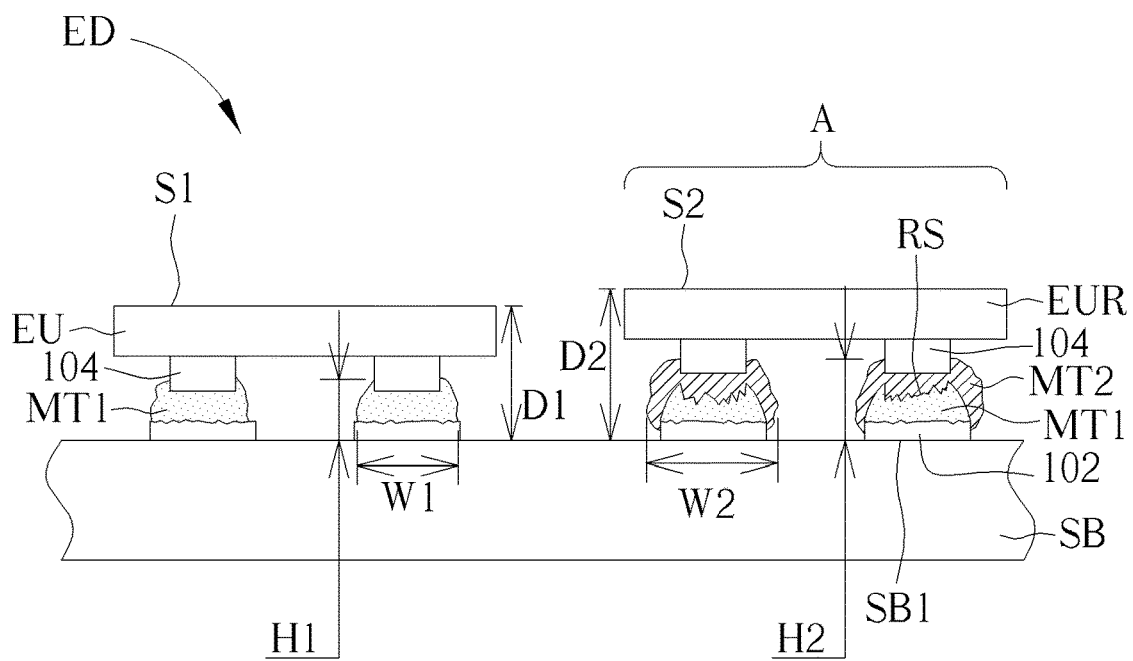

Referring to FIG. 1 to FIG. 5, FIG. 1 is a process flowchart of a method for manufacturing an electronic device according to a first embodiment of the present disclosure, FIG. 2 is a schematic diagram illustrating the manufacturing processes and related equipment and devices of the method for manufacturing an electronic device according to the first embodiment of the present disclosure, FIG. 3 is a schematic diagram of a partial enlargement of the substrate shown in FIG. 2, and FIG. 4 to FIG. 5 are schematic diagrams of sectional views showing manufacturing processes of the method for manufacturing the electronic device according to the first embodiment of the present disclosure. According to a first embodiment of the present disclosure, the method for manufacturing an electronic device comprises performing Step S100: providing a substrate SB. As shown in Part (1) of FIG. 2 and FIG. 3, the substrate SB may comprise a transparent substrate, for example, a rigid substrate such as a glass substrate or a quartz substrate, or a flexible substrate such as a plastic substrate, but not limited thereto. The electronic device may comprise the substrate SB, a plurality of conductive lines and a plurality of connecting pads on a surface SB1 of the substrate SB. For example, a plurality of data lines DL, a plurality of gate lines GL, and a plurality of common lines CL may be disposed on the surface SB1 of the substrate SB, and a plurality of connecting pads 102 are also disposed on the surface SB1 of the substrate SB.

In an embodiment, the surface SB1 of the substrate SB may be a plane surface. In another embodiment, the substrate SB may have a terrain and the surface SB1 of the substrate SB may be an uneven surface. In an embodiment, at least a portion of one of the connecting pads 102 may pass through at least one insulating layer on the substrate SB to connect with a driving circuit (not shown). The driving circuit may comprise switch elements, such as thin-film transistors.

Some connecting pads 102 (connecting pads 1022 shown in FIG. 3) may be electrically connected to the common lines CL, and some connecting pads 102 (connecting pads 1021 shown in FIG. 3) may be electrically connected to the data lines DL and the gate lines GL through the switch elements 130, wherein the switch elements 130 may be thin film transistors (TFT) in this embodiment, but not limited thereto. In some embodiments, the switch elements 130 may be replaced by integrated chips (ICs), wherein the ICs are electrically connected to the data lines DL and control the light emitting units EU to emit light through the connecting pads 1022. The substrate SB with the light emitting units EU may be a light source (such as a back light component) or a display panel of the electronic device ED. For example, the substrate SB with the light emitting units EU is an active display panel. A plurality of pixels PX may be defined on the substrate SB, and each pixel PX may comprise a plurality of sub-pixels PXS1, PXS2, PXS3. For example, the light emitting units EU may comprise three kinds of light emitting units EU1, EU2, EU3 that can produce different color light, such as blue light, green light and red light, but not limited thereto. The boundary of the sub-pixels PXS1, PXS2, PXS3 can be defined by the connection line of the middle points of the minimum distances of adjacent light emitting units EU1, EU2, EU3, and the total area of the sum of the light emitting units EU1, EU2, EU3 is the area of one pixel PX.

Then, Step S102 is performed to apply a first bonding material MT1 on the substrate SB, wherein the first bonding material MT1 is omitted in FIG. 2 and FIG. 3, but shown in FIG. 4. The first bonding material MT1 may comprise any suitable material used for bonding package elements to connecting pads. For example, the first bonding material MT1 may comprise solder material or eutectic material or may be an anisotropic conductive film (ACF). In this embodiment, a eutectic material is adopted for the first bonding material MT1 for instance. Common eutectic material may comprise Al—Si alloy, Al—Ge alloy, Au—Si alloy, Au—Ge alloy, Au—Sn alloy, and Cu—Sn alloy, whose melting points may be in the range from 250° C. to 350° C., but not limited thereto. Step S104 is following carried out to bonding a plurality of light emitting units EU to the substrate SB through the first bonding material MT1. For bonding the light emitting units EU, a first equipment EP1 is adopted to transfer the light emitting units EU to the substrate SB. The first equipment EP1 may have a transfer stage and a plurality of vacuum chucks EP12, such that the first equipment EP1 can massively transfer the light emitting units EU at the same time. In some other embodiments, the first equipment EP1 may comprise an electrostatic device, an electric-magnetic device or adhesive stamps to replace the vacuum chucks EP12. When transferring the light emitting units EU to the substrate SB, an alignment process may be proceed based on the alignment mark(s) on the substrate SB, and therefore the light emitting units EU can be accurately loaded on the substrate SB and electrically connected to corresponding connecting pads 102 through the first bonding material MT1. The light emitting units EU may comprise one or more electrodes 104 at their bottom surface. Each electrode 104 may correspond to one connecting pad 102, and the first bonding material MT1 is positioned between the electrodes 104 and their corresponding connecting pads 102 after the bonding process. As shown in Part (2) of FIG. 2, the light emitting units EU are arranged as an array on the substrate SB.

Then, Step S106 is proceeded to identify a defective light emitting unit ER from the plurality of light emitting units EU. For example, a photoluminescence test and/or an electroluminescence test may be performed for detecting whether defective light emitting unit (s) exists or not. For illustration, Part (2) of FIG. 2 shows two defective light emitting units ER are identified in the corresponding position A and corresponding position B as an example. After identifying the corresponding positions of the defective light emitting units ER, the test result may be reported to the control system, and therefore a repairing process will be performed to replace the defective light emitting units ER with new light emitting units.

Step S108 is then proceeded to remove the defective light emitting units ER from the corresponding position A on the substrate SB, as shown in Part (3) in FIG. 2. In this embodiment, a second equipment EP2 is adopted by removing the defective light emitting units ER, and the second equipment EP2 may be different from the first equipment EP1 and may have one vacuum chuck EP22. In some embodiments, the second equipment EP2 may comprise an electrostatic device, an electric-magnetic device or an adhesive stamp to replace the vacuum chuck EP22. In other embodiments, the first equipment EP1 may still be utilized in Step S108. As shown in FIG. 2, one defective light emitting unit ER is removed in one removing procedure since the second equipment EP2 has one vacuum chuck EP22 in this embodiment. For example, the defective light emitting unit ER in the corresponding position A is picked up by the second equipment EP2, while the other defective light emitting unit ER in the corresponding position B is remained on the substrate SB. Before removing the defective light emitting unit ER in the corresponding position A, the second equipment EP2 may perform an alignment process according to the alignment mark on the substrate SB, so as to pick up the correct defective light emitting unit ER from the corresponding position A. In some other embodiments, two or more defective light emitting units ER may be removed in the Step S108 at the same time, which means the defective light emitting units ER in both the corresponding position A and the corresponding position B may be removed together.

Then, Step S110 is performed to apply a second bonding material MT2 for bonding a repairing light emitting unit EUR, as shown in FIG. 4. In this embodiment, the second bonding material MT2 may be applied on the connecting pads 102 in the corresponding position A on the substrate SB, from which the defective light emitting unit ER is removed. The second bonding material MT2 may be different from or the same as the first bonding material MT1. In detail, the main composition of the second bonding material MT2 may be different from or the same as the main composition of the first bonding material MT1. In some embodiment, the second bonding material MT2 may comprise the material with a lower melting point than that of the first bonding material MT1. For example, the second bonding material MT2 may be a solder material with a melting point in the range from 90° C. to 450° C., but not limited thereto. In this embodiment, the first bonding material MT1 may be remained in the corresponding position A, and the second bonding material MT2 is applied on the first bonding material MT1. After the defective light emitting unit ER is pulled out from the first bonding material MT1 on the connecting pads 102, the top surface of the first bonding material MT1 may have one or more caves which contained the electrodes 104 of the defective light emitting units ER when it was not removed. In addition, in some embodiments, the remained first bonding material MT1 may have a roughness surface RS. In some other embodiments, the first bonding material MT1 may be totally removed or partially removed from the corresponding position A before applying the second boding material MT2.

Step S112 is then carried out to bonding a repairing light emitting unit EUR to the corresponding position A through the second bonding material MT2. As shown in Part (4) of FIG. 2, the second equipment EP2 may be used for transferring the repairing light emitting unit EUR to the corresponding position A. Then, the repairing light emitting unit EUR is bonded on the surface SB1 of the substrate SB in the corresponding position A by using the second bonding material MT2, as shown in Part (5) of FIG. 2 and FIG. 5. After bonding the repairing light emitting unit EUR on the substrate SB, the second bonding material MT2 is positioned between the repairing light emit unit EUR and the substrate SB. Since the first bonding material MT1 is not removed from the corresponding position A in this embodiment, the second bonding material MT2 is also positioned between the repairing light emitting unit EUR and the first bonding material MT1. Referring to FIG. 5, the first bonding material MT1 and the second bonding material MT2 may have an interface with roughness, shown as the roughness surface RS. Further adjustment process (such as annealing or etching process) may be performed to reduce the contact resistance of the roughness surface RS between the first bonding material MT1 and the second bonding material MT2, such that the brightness/color performance of the repairing light emitting unit EUR may be substantially the same as the brightness/color performance of the light emitting unit EU. In addition, the width W1 of the first bonding material MT1 a long a direction is less than the width W2 of the second bonding material MT2 along the same direction. It could be considered as that the size or the area of the first bonding material MT1 corresponding to one of the light emitting units EU (or to the corresponding position A) is smaller than the size or the area of the second bonding material MT2 corresponding to one repairing light emitting unit EUR (or to the corresponding position A). Further, after bonding the repairing light emitting unit EUR to the corresponding position A, the maximum height H1 of the first bonding material MT1 on the substrate SB (defined by the distance between the top surface of the first bonding material MT1 to the surface SB1 of the substrate SB) is less than the maximum height H2 of the second bonding material MT2 on the substrate SB (defined by the distance between the top surface of the second bonding material MT2 to the surface SB1 of the substrate SB). In addition, the distance D1 from the top surface S1 of one of the light emitting units EU to the surface SB1 of the substrate SB is less than the distance D2 from the top surface S2 of the repairing light emitting unit EUR to the surface SB1 of the substrate SB because the second bonding material MT2 is further positioned between the repairing light emitting unit EUR and the substrate SB. In some embodiments, the contact resistance of the interface (such as the roughness surface RS) between the first bonding material MT1 and the second bonding material MT2 may be adjusted to modulate the brightness of the repairing light emitting unit EUR such that the whole brightness of the repairing light emitting unit EUR and the light emitting units EU may be more uniformed.

Then, Step S108 to Step S112 could be repeated to remove the defective light emitting unit ER in the corresponding position B and to bond another repairing light emitting unit EUR in the corresponding position B through the second bonding material MT2, so as to repair the defects of the electronic device ED.

Referring to the Part (5) of FIG. 2 and FIG. 5, the present disclosure provides an electronic device ED that comprises a substrate SB, a plurality of light emitting units EU and at least one repairing light emitting unit EUR arranged as an array on the substrate SB, a first bonding material MT1 disposed between the plurality of light emitting units EU and the substrate SB, and a second bonding material MT2 disposed between the at least one repairing light emitting unit EUR and the substrate SB.

Figure 6:
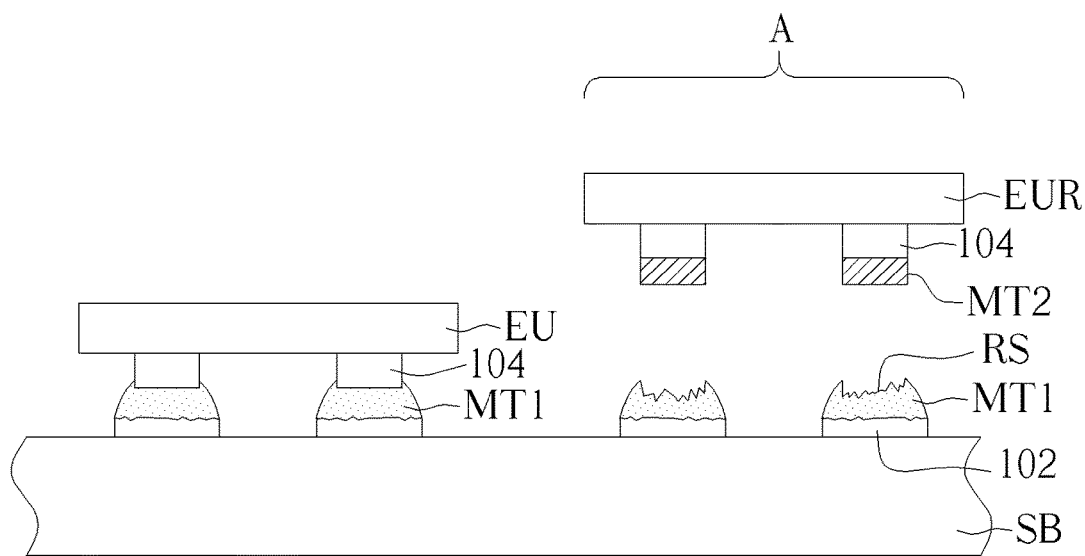
FIG. 6 is a sectional schematic diagram of a partial enlargement of an electronic device according to a first variant embodiment of the first embodiment of the present disclosure.

Referring to FIG. 6, FIG. 6 is a sectional schematic diagram of a partial enlargement of an electronic device according to a first variant embodiment of the first embodiment of the present disclosure. In Step S110 of this variant, the second bonding material MT2 is first applied onto one or more of the electrodes 104 of the repairing light emitting unit EUR, before bonding the repairing light emitting unit EUR onto the corresponding position A in Step S112.

Figure 7:
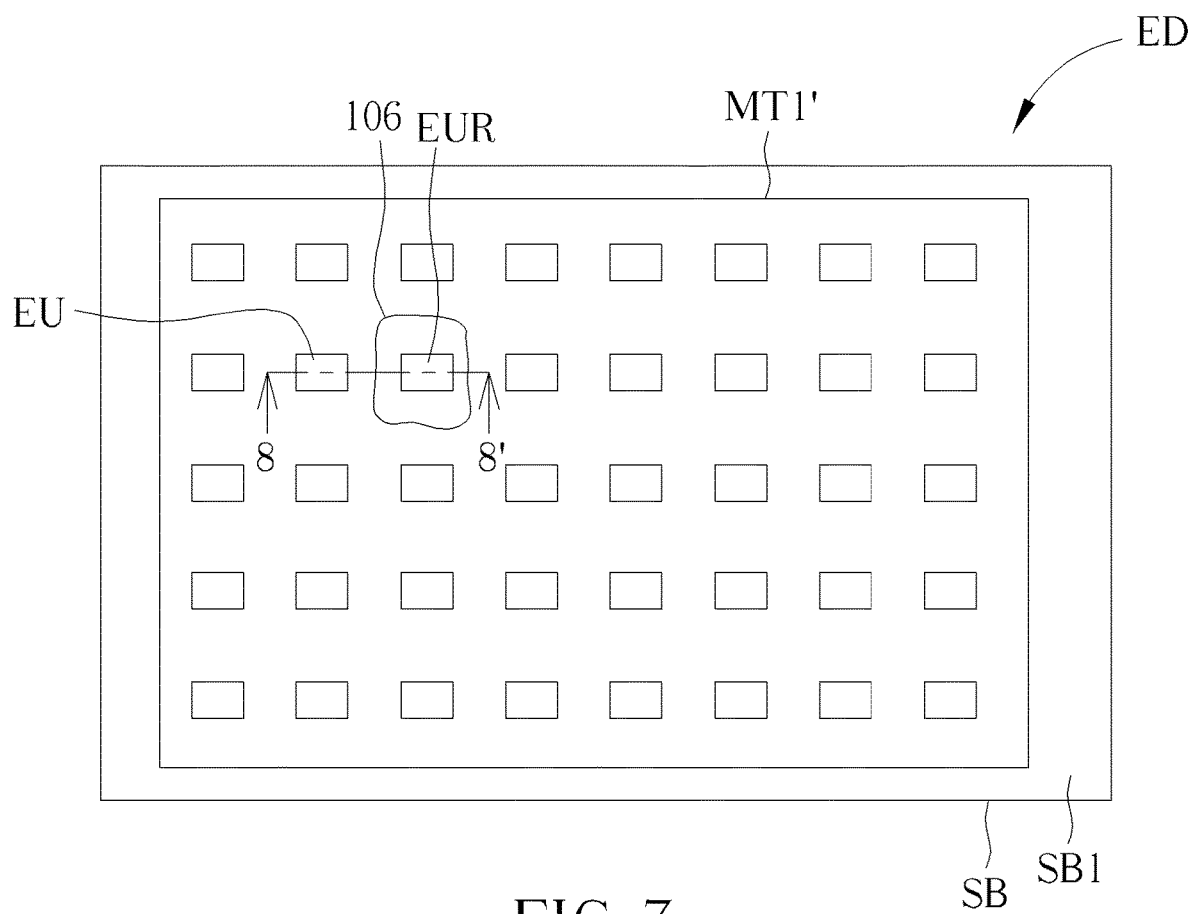
FIG. 7 is a schematic diagram of top view of an electronic device according to a second variant embodiment of the first embodiment of the present disclosure.
Figure 8:
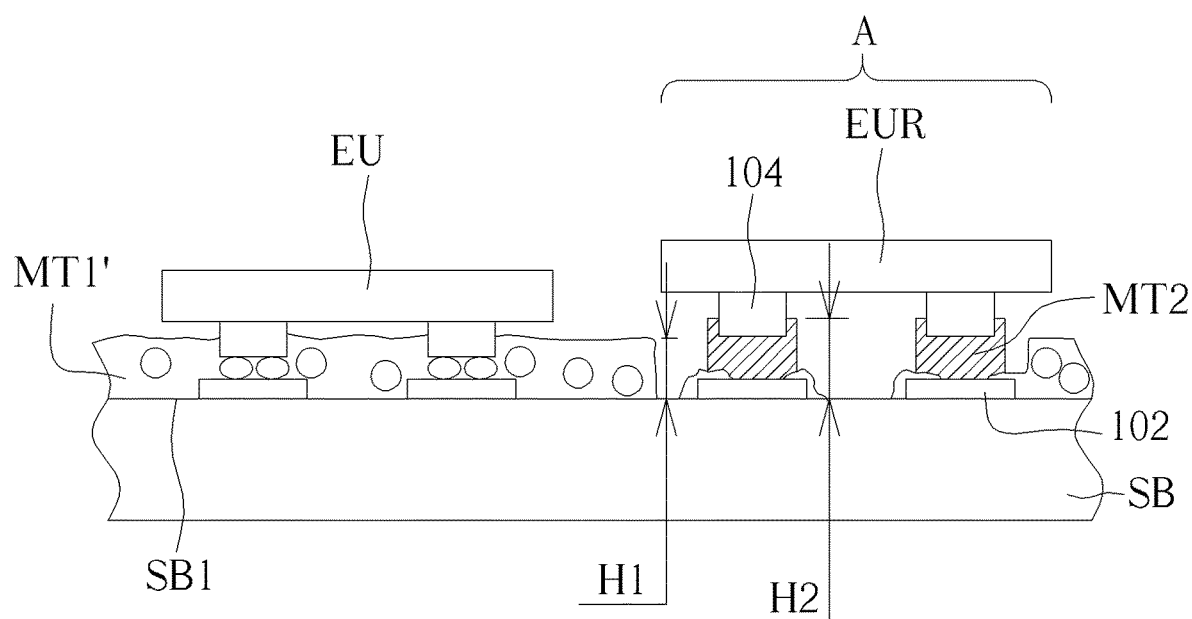
FIG. 8 is a sectional schematic diagram of a partial enlargement along cross-section line 8-8' of the electronic device shown in FIG. 7.

Referring to FIG. 7 and FIG. 8, FIG. 7 is a schematic diagram of top view of an electronic device according to a second variant embodiment of the first embodiment of the present disclosure, and FIG. 8 is a sectional schematic diagram of a partial enlargement along cross-section line 8-8' of the electronic device shown in FIG. 7. This variant embodiment is different from the first embodiment in that the anisotropic conductive film is used as the first bonding material MT1' for bonding the light emitting units EU in Step S104. The first bonding material MT1' may be applied on the most area of the surface SB1 of the substrate SB. In addition, after a defective light emitting unit ER is identified and removed, a portion of the first bonding material MT1' corresponding to the defective light emitting unit ER may be removed, such that an opening or a cave 106 is formed in the first bonding material MT1'. Then, the repairing light emitting unit EUR is bonded on the exposed connecting pads 102 on the surface SB1 of the substrate SB through the second bonding material MT2. In some embodiments, the portion of the first bonding material MT1' corresponding to the defective light emitting unit ER is completely removed, thus there is no first bonding material MT1' remained between the repairing light emitting unit EUR and the connecting pads 102, and the maximum height H1 of the first bonding material MT1' may be similar to the maximum height H2 of the second bonding material MT2. In some embodiments, the first bonding material MT1' may be remained between the repairing light emitting unit EUR and the connecting pads 102, and an interface with roughness may exist between the first bonding material MT1' and the second bonding material MT2, as shown in FIG. 8. In this variant embodiment, the maximum height H1 of the first bonding material MT1' is still less than the maximum height H2 of the second bonding material MT2.

Figure 9:
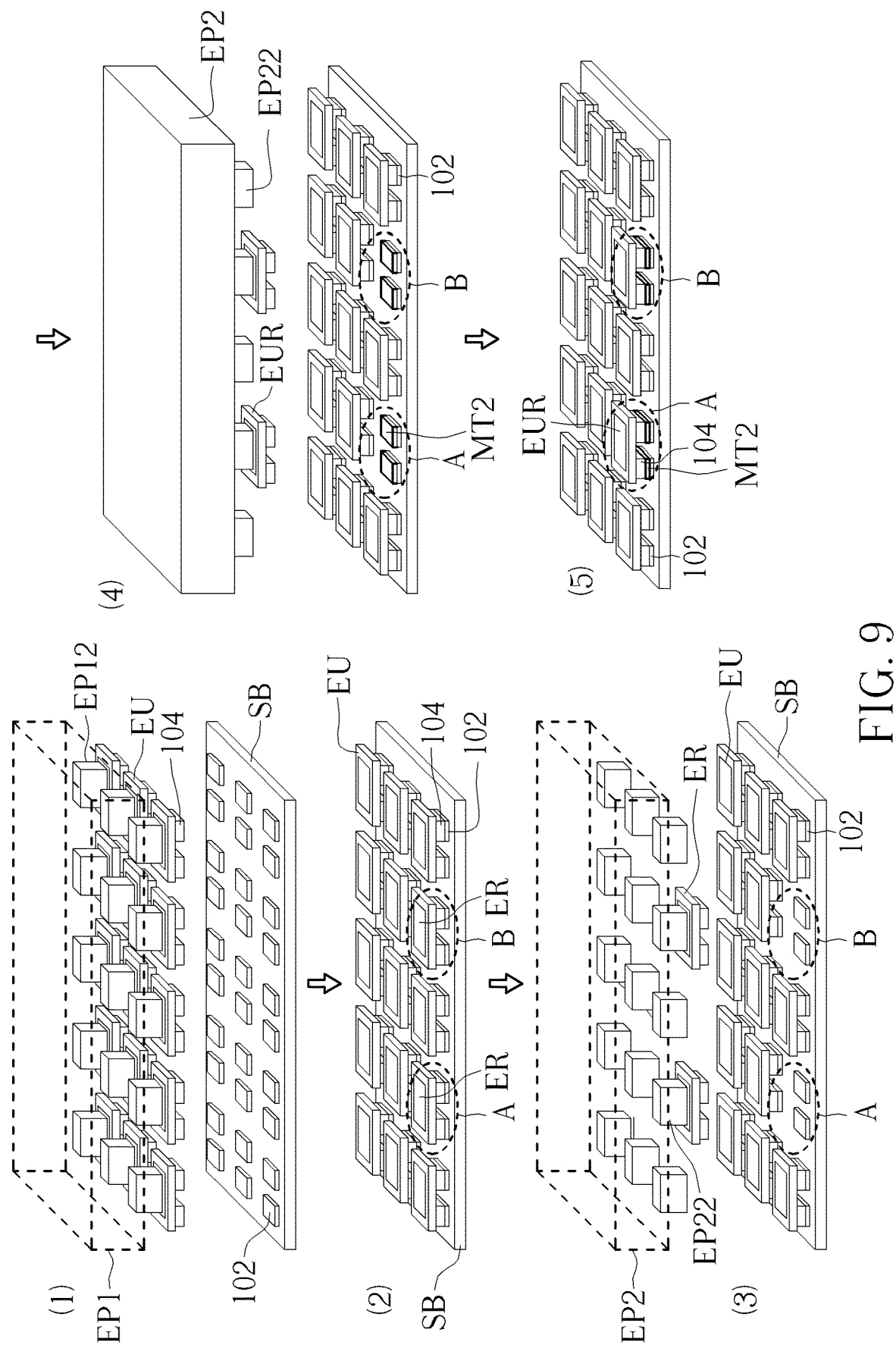
FIG. 9 is a schematic diagram illustrating the manufacturing processes and related equipment and devices of the method for manufacturing an electronic device according to a third variant embodiment of the first embodiment of the present disclosure.

Referring to FIG. 9, FIG. 9 is a schematic diagram illustrating the manufacturing processes and related equipment and devices of the method for manufacturing an electronic device according to a third variant embodiment of the first embodiment of the present disclosure. This embodiment is mainly different from the first embodiment in that the second equipment EP2 may comprise a plurality of vacuum chucks EP22, and therefore the defective light emitting units ER in the corresponding position A and the corresponding position B can be picked up in the same procedure, as shown in Part (3) of FIG. 9. Then, two repairing light emitting units EUR can be transferred to the corresponding position A and the corresponding position B and be bonded to the corresponding position A and the corresponding position B through the second bonding material MT2 at the same time, as shown in Part (4) and Part (5) of FIG. 9. The second equipment EP2 may be different from the first equipment EP1 in some embodiments, but not limited thereto. The first equipment EP1 may be adopted for removing the defective light emitting units ER and transferring the repairing light emitting units EUR in some other embodiments. In other words, the tools used in Step S102 and Step S110 shown in FIG. 1 can be the same or different.

Figure 10:
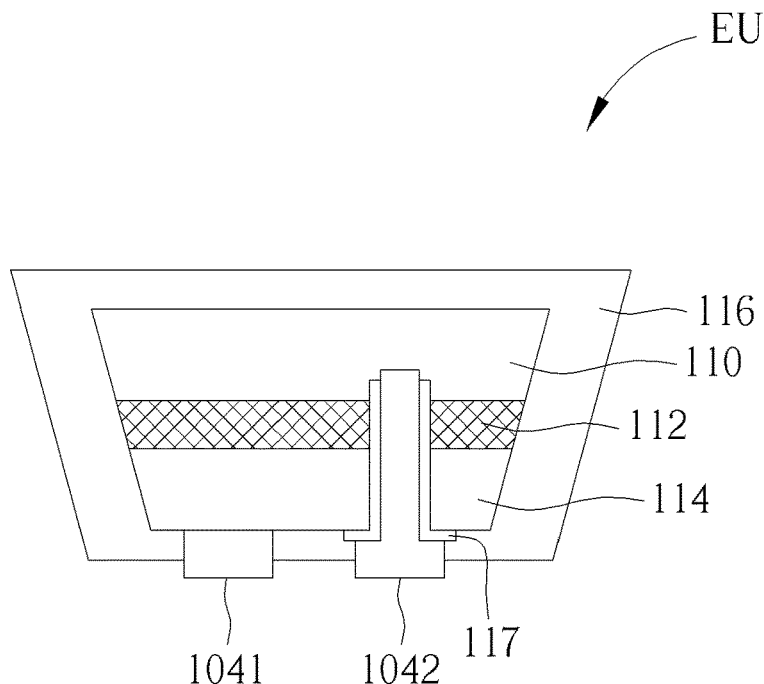
FIG. 10 is a sectional schematic diagram of light emitting unit of the first embodiment of the electronic device of the present disclosure.

Referring to FIG. 10, FIG. 10 is a sectional schematic diagram of light emitting unit of the first embodiment of the electronic device of the present disclosure. The light emitting unit EU used for forming the electronic device ED mentioned above may be a light emitting diode (LED). For example, the light emitting unit EU may be a micro LED or a mini Led in the first embodiment, but not limited thereto.

In some embodiments, the light emitting unit EU may be a quantum LED. The light emitting unit EU comprises a first semiconductor layer 114, a light emitting layer 112, and a second semiconductor layer 110, wherein the light emitting layer 112 may be, but not limited to, a multiple quantum well (MQW) layer for example. The light emitting unit EU further comprises a first electrode 1041 electrically connected to the first semiconductor layer 114 and a second electrode 1042 electrically connected to the second semiconductor layer 110. A passivation layer 117 is disposed between the first semiconductor layer 114 and the second electrode 1042 and between the light emitting layer 112 and the second electrode 1042. In addition, the light emitting unit EU may optionally comprise an encapsulation layer 116 encompassing the first semiconductor layer 114, the light emitting layer 112, and the second semiconductor layer 110 but exposing the first electrode 1041 and the second electrode 1042 at the bottom side of the light emitting unit EU. In some other embodiments, the light emitting unit EU may not have the encapsulation layer 116.

Figure 11:
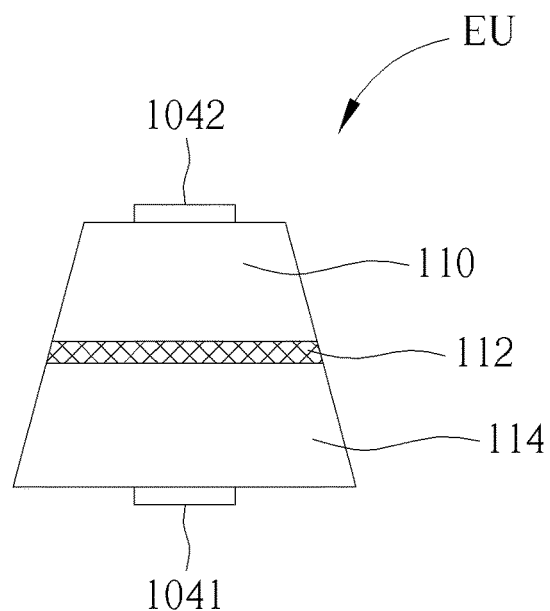
FIG. 11, FIG. 12A, FIG. 12B, and FIG. 13 are sectional schematic diagrams of light emitting units of different types that can be used in the electronic device of the present disclosure.
Figure 12A:
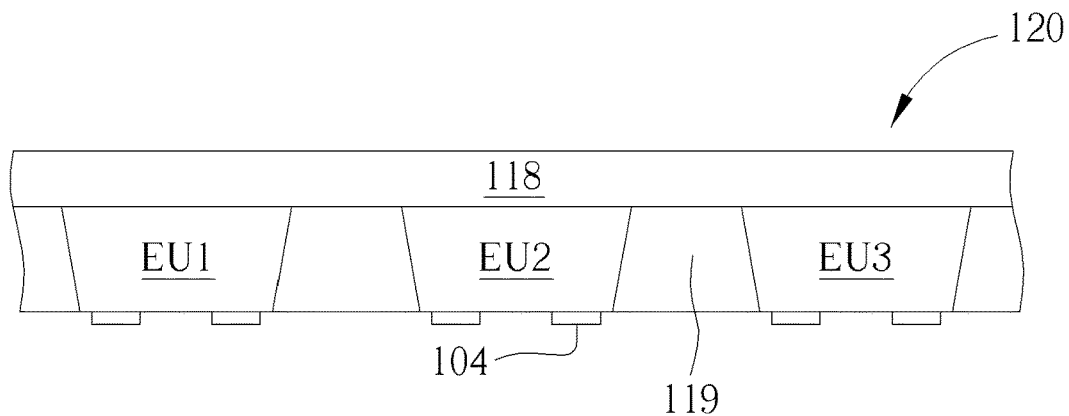
Figure 12B:
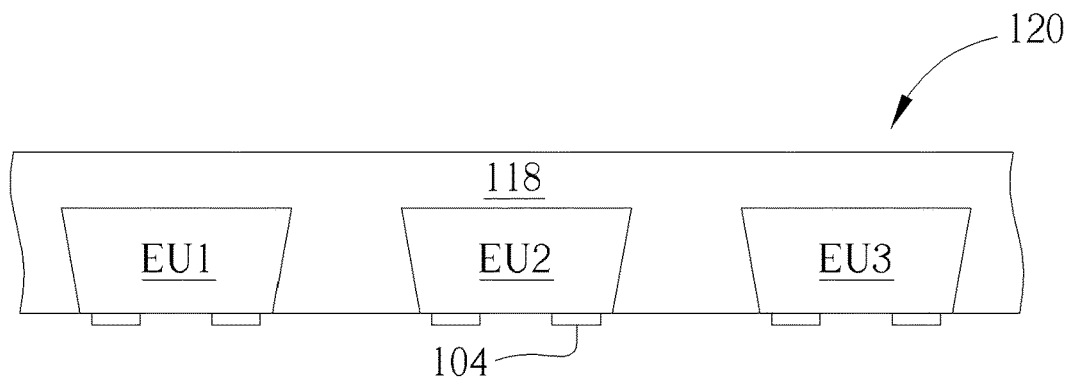
Figure 13:
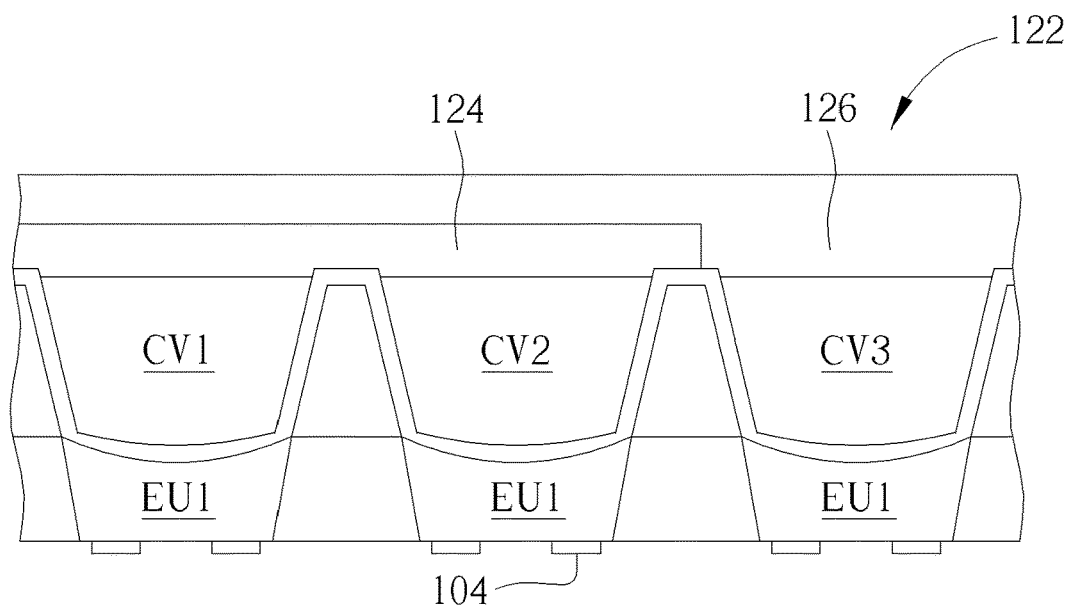

Referring to FIG. 11 to FIG. 13, FIG. 11 to FIG. 13 are sectional schematic diagrams of light emitting units of different types that can be used in the electronic device of the present disclosure. As shown in FIG. 11, the light emitting unit EU may be a vertical-type LED. The first electrode 1041 electrically connected to the first semiconductor layer 114 is positioned at the bottom of the light emitting unit EU. However, the second electrode 1042 electrically connected to the second semiconductor layer 110 is positioned at the top of the light emitting unit EU. Accordingly, when adopting the vertical-type LED as the light emitting unit EU, it may be bonded onto the connecting pad 102 on the surface SB1 of the substrate SB in Step S104. After bonding the vertical-type LED onto the substrate SB, other conductive lines may be formed on the vertical-type LED to electrically connect the second electrode 1042 of the vertical-type LED. As shown in FIG. 12A, in some embodiments, a light-emitting package 120 including three light emitting units EU1, EU2, EU3 may be used for manufacturing the electronic device ED. An encapsulation material 119 may be used for packaging three light emitting units EU1, EU2, EU3 together. The encapsulation material 119 may comprise (but not limited thereto) resin, epoxy or other suitable material. A protection layer 118 may be formed on the light emitting units EU1, EU2, EU3. The light emitting units EU1, EU2, EU3 may respectively produce different color lights, such as blue light, green light, and red light. In FIG. 12B, the protection layer 118 may replace the above-mentioned encapsulation material 119. In other words, the protection layer 118 and the encapsulation material 119 may comprise the same material and may be formed at the same time for packaging the light emitting units EU1, EU2, EU3. The protection layer 118 may comprise (but not limited thereto) resin, epoxy or other suitable material. In FIG. 13, another type of light-emitting package 122 is illustrated. Each light-emitting package 122 comprises three light emitting units EU1 that produce light with the same color, such as blue light, and a first light-converting layer CV1 and a second light-converting layer CV2 are formed on two of the light emitting units EU1, such that the first light-converting layer CV1 and the second light-converting layer CV2 can respectively converting the color light emitted from the light emitting units EU1 to other color lights, such as green light and red light. In some embodiments, a third light-converting layer CV3 can be formed on the other light emitting unit EU1 for enhancing the light performance. In addition, the light-emitting package 122 may optionally comprise a filter layer 124 disposed on the first light-converting layer CV1 and the second light-converting layer CV2 and a protection layer 126 disposed on the light emitting units EU1.

Figure 14:
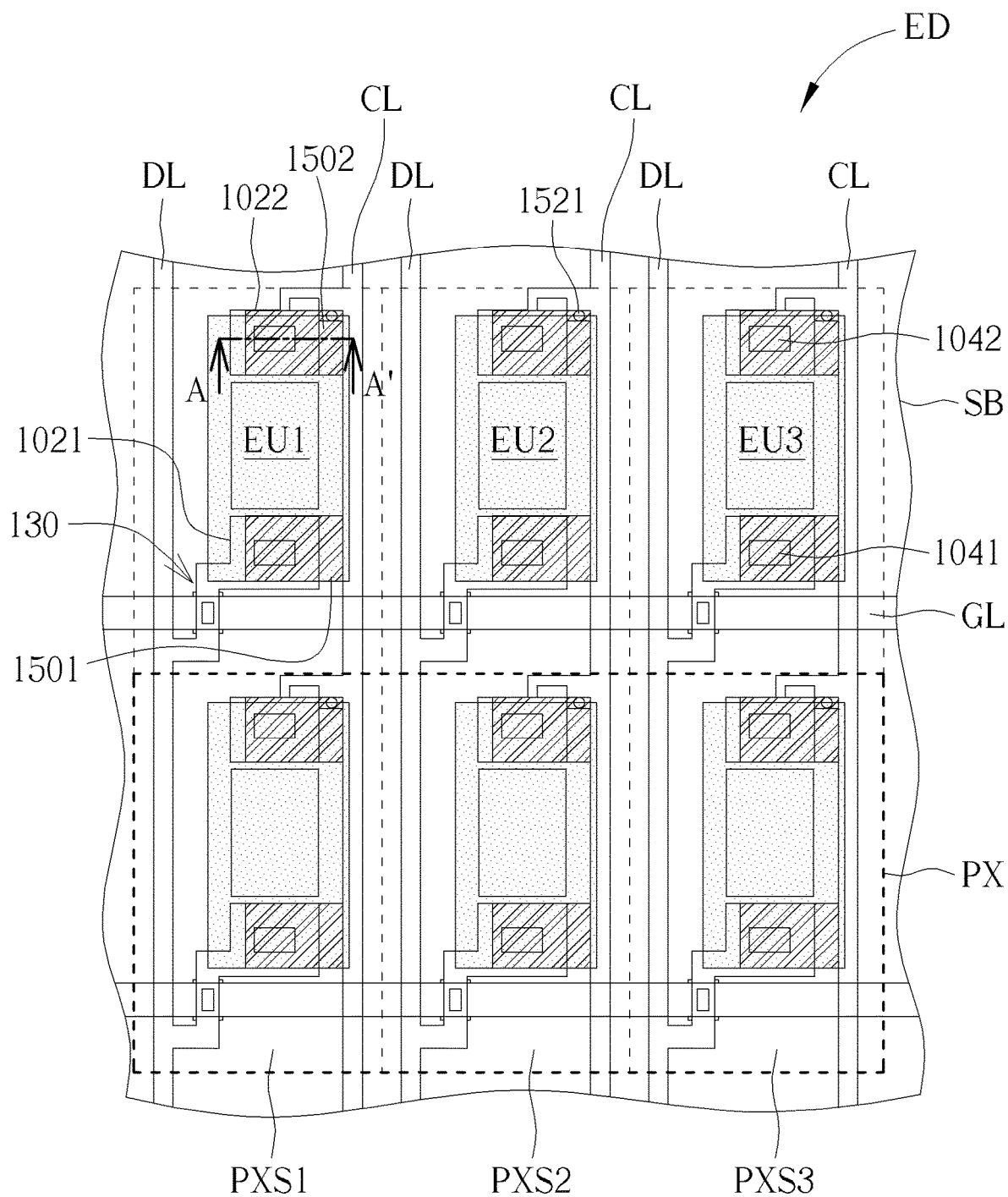
FIG. 14 is a schematic diagram of a partial top view of an electronic device according to a second embodiment of the present disclosure.
Figure 15:
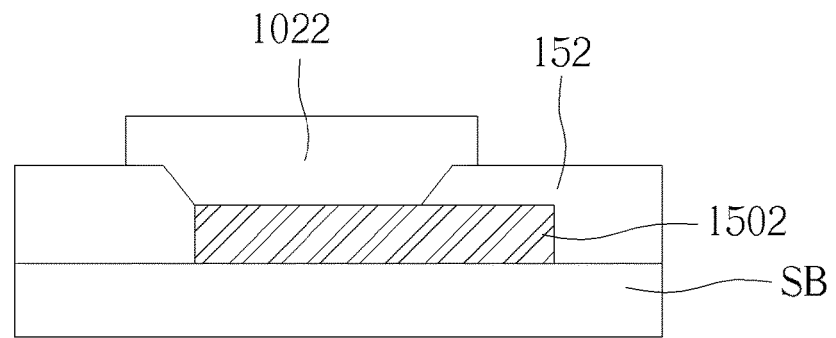
FIG. 15 is a sectional schematic diagram of a partial enlargement of the connecting pads shown in FIG. 14.

Referring to FIG. 14 and FIG. 15, FIG. 14 is a schematic diagram of a partial top view of an electronic device according to a second embodiment of the present disclosure, and FIG. 15 is a sectional schematic diagram of a partial enlargement of the connecting pads 1021/1022 along cross-section line A-A' of the electronic device shown in FIG. 14. With comparison to FIG. 3, the electronic device ED of this embodiment comprises a plurality of redundant pads 1501 and 1502 disposed on the substrate SB. The redundant pads 1501 and 1502 are made of a conductive layer (such as a first metal layer) different from the conductive layer (such as a second metal layer) that forms the connecting pads 1021 and 1022. The redundant pads 1501 and 1502 are partially overlapped by the corresponding connecting pads 1021 and 1022 and are electrically connected to the corresponding connecting pads 1021 and 1022 respectively. If a defective light emitting unit ER is identified and removed from the substrate SB, the connecting pads 1021 and 1022 originally connected to the defective light emitting unit ER may be damaged or have uncompleted surface in some cases. In this situation, the redundant pads 1501 and 1502 can still provide the function the same as the connecting pads 1021 and 1022 such that the new bonded repairing light emitting units EUR can be electrically connected to the corresponding connecting pads 1021 and 1022 and the redundant pads 1501 and 1502. The common lines CL may extend to the redundant pads 1502 to cover a portion of the corresponding redundant pads 1502. Via holes 1521 (shown as the circles in FIG. 14) may be formed in an insulating layer 152 between the extending parts of the common lines CL and the redundant pads 1502 for electrically connecting the common lines CL to the corresponding redundant pads 1502. It may optionally comprise at least one layer between the redundant pads 1502 and the substrate SB or between the insulating layer 152 and the substrate SB.

Figure 16:
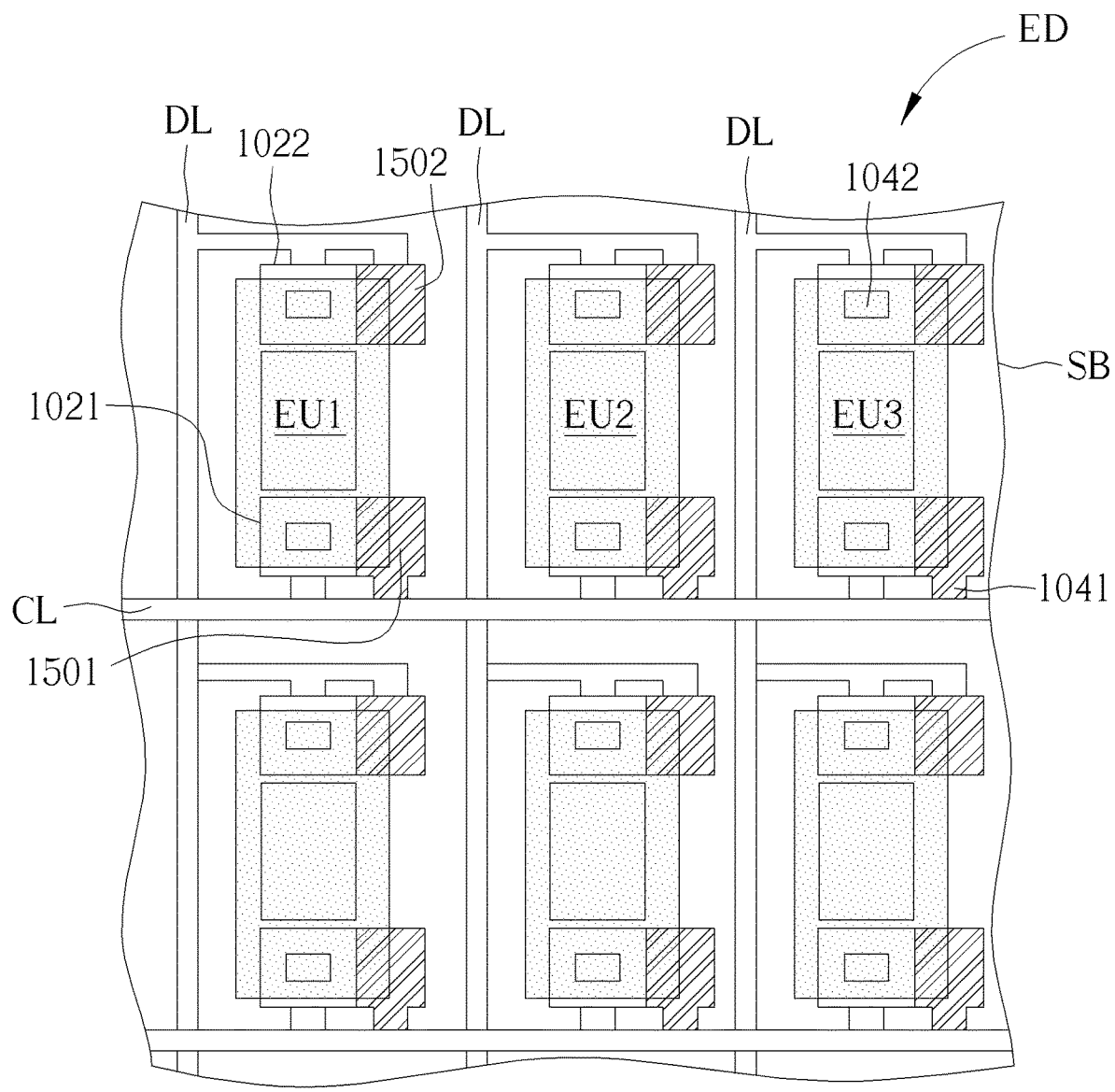
FIG. 16 is a schematic diagram of a partial top view of an electronic device according to a third embodiment of the present disclosure.

Referring to FIG. 16, FIG. 16 is a schematic diagram of a partial top view of an electronic device according to a third embodiment of the present disclosure. This embodiment is different from the second embodiment in that the electronic device ED shown in FIG. 16 may comprise a passive light emitting panel (or a passive display panel). The first electrodes of the light emitting units EU1, EU2, EU3 are electrically connected to corresponding common lines CL, and the second electrodes of the light emitting units EU1, EU2, EU3 are electrically connected to corresponding data lines DL. No switch elements is disposed between the light emitting units EU1, EU2, EU3, but not limited thereto. In this embodiment, the redundant pads 1501 and 1502 are also formed and overlapped by the corresponding connecting pads 1021 or 1022. The overlapping area of the redundant pads 1501 and 1502 and the corresponding connecting pads 1021 or 1022 can be adjusted.

Figure 17:
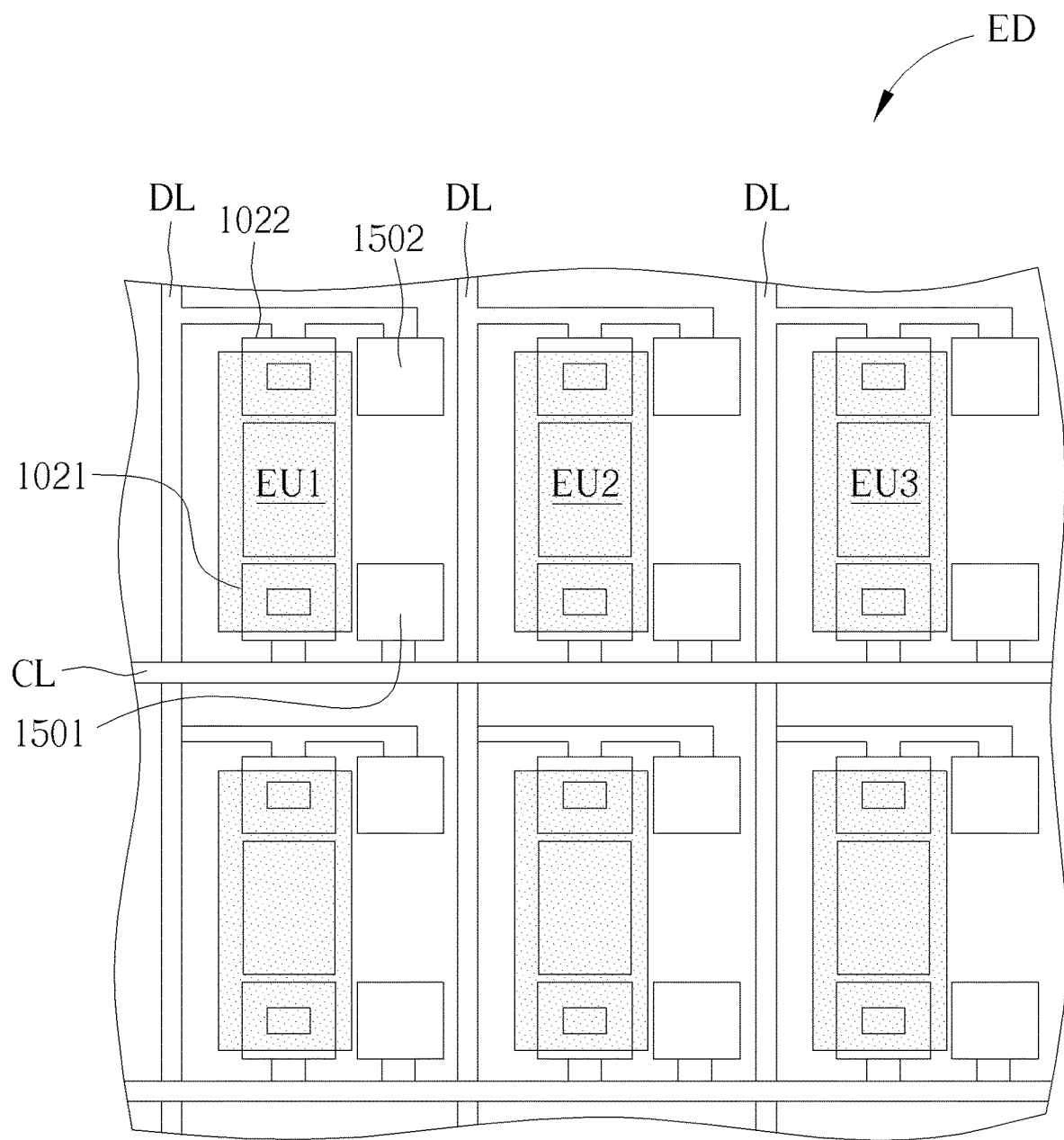
FIG. 17 is a schematic diagram of a partial top view of an electronic device before the repairing process according to a fourth embodiment of the present disclosure.
Figure 18:
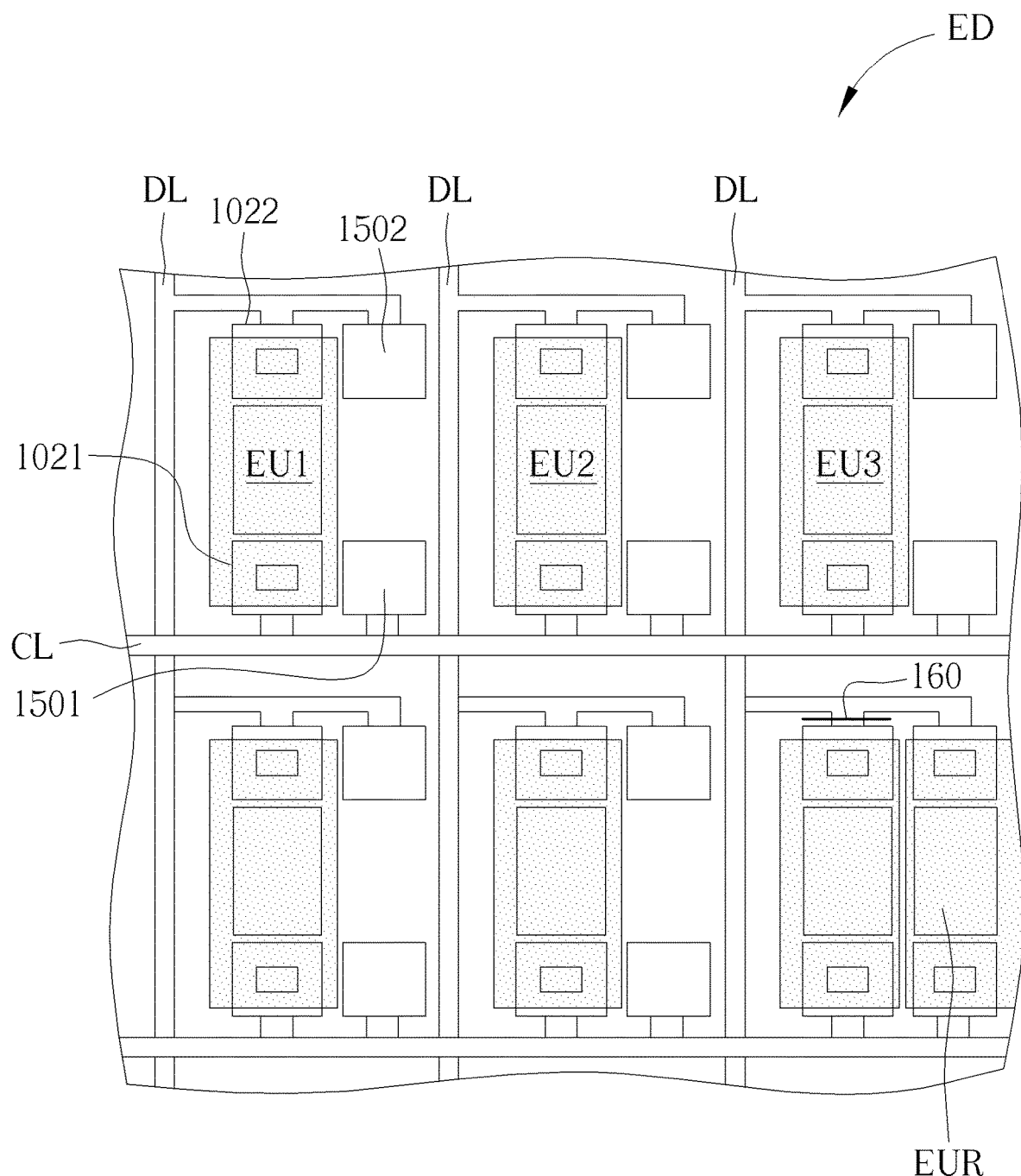
FIG. 18 is a schematic diagram of a partial top view of the electronic device shown in FIG. 17 after the repairing process.

Referring to FIG. 17 and FIG. 18, FIG. 17 is a schematic diagram of a partial top view of an electronic device before the repairing process according to a fourth embodiment of the present disclosure, and FIG. 18 is a schematic diagram of a partial top view of the electronic device shown in FIG. 17 after the repairing process. As shown in FIG. 17, the fourth embodiment is different from the third embodiment in that the redundant pads 1501 and 1502 are not overlapped by the connecting pads 1021 and 1022 in this embodiment, and the redundant pads 1501, 1502 and the connecting pads 1021, 1022 may be made of the same conductive layer, such as the same metal layer. If a defective light emitting unit ER is identified, the repairing process may comprise performing a cut-off process 160 to the conductive line of the connecting pad 1022 that is electrically connected to the defective light emitting unit ER (such as the light emitting unit EU3 is defective). Then, a repairing light emitting unit EUR is provided and bonded on the redundant pads 1501 and 1502 by the second bonding material. In this embodiment, the defective light emitting unit EU3 may not be removed, and the repairing light emitting unit EUR is positioned adjacent to the defective light emitting unit EU3. For example, the repairing light emitting unit EUR is positioned in the same sub-pixel or the same pixel as the defective light emitting unit EU3.

According to the method for manufacturing the electronic device of the present disclosure, the defective light emitting unit may be removed and replaced by the repairing light emitting unit, and a second bonding material is used for bonding the repairing light emitting unit. Accordingly, the second bonding material may provide a good electrical connection between the repairing light emitting unit and the connecting pads on the substrate. When there is no space for disposing redundant light emitting units in the sub-pixels, such as in the high resolution display panels, the present disclosure provides a repairing process to effectively replace the defective light emitting units by the repairing light emitting units. In some embodiments, redundant pads may be disposed on the substrate. The redundant pads can be partially overlapped by the connecting pads in order to save the sub-pixel space. Even though the redundant pads is formed on the substrate, no redundant light emitting unit is pre-disposed on the substrate, and repairing light emitting unit would be positioned on the redundant pads when defective light emitting units are identified. Accordingly, the cost of light emitting units may be reduced. In addition, since a second bonding material is used for bonding the repairing light emitting unit on the substrate, the repairing light emitting unit may have a greater height than other light emitting units originally bonded on the substrate through the first bonding material.

Those skilled in the art will readily observe that numerous modifications and alterations of the device and method may be made while retaining the teachings of the disclosure. Accordingly, the above disclosure should be construed as limited only by the metes and bounds of the appended claims.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing an electronic device, comprising:
 providing a substrate;
 forming a plurality of connecting pads and a plurality of conductive portions partially overlapped by the plurality of connecting pads on a surface of the substrate, wherein an insulating layer is disposed between the plurality of connecting pads and the plurality of conductive portions;
 forming a plurality of conductive lines on the substrate, wherein the plurality of conductive lines are electrically connected to the plurality of conductive portions;
 bonding a plurality of light emitting units to the plurality of connecting pads;

identifying a defective light emitting unit from the plurality of light emitting units;

removing the defective light emitting unit from a corresponding position on the substrate; and bonding another light emitting unit to the corresponding position.

2. The method for manufacturing the electronic device of claim 1, wherein one of the plurality of connecting pads is electrically connected to one of the plurality of conductive lines through one of the plurality of conductive portions.

3. The method for manufacturing the electronic device of claim 2, wherein the one of the plurality of conductive lines is a data line.

4. The method for manufacturing the electronic device of claim 2, wherein a portion of the one of the plurality of conductive lines is overlapped with at least one of the plurality of light emitting units.

5. The method for manufacturing the electronic device of claim 1, further comprising applying a bonding material on the plurality of the connecting pads.

6. The method for manufacturing the electronic device of claim 5, wherein the plurality of light emitting units are bonded to the plurality of connecting pads through the bonding material.

7. The method for manufacturing the electronic device of claim 1, wherein one of the plurality of connecting pads is directly connected to one of the plurality of conductive lines.

8. The method for manufacturing the electronic device of claim 7, wherein the one of the plurality of conductive lines is a data line.

9. The method for manufacturing the electronic device of claim 1, wherein the insulating layer has at least one via hole, and one of the plurality of connecting pads is electrically connected to one of the plurality of conductive portions through the at least one via hole.

10. A method for manufacturing an electronic device, comprising:

providing a substrate;

forming a plurality of connecting pads and a plurality of conductive portions partially overlapped by the plurality of connecting pads on a surface of the substrate;

forming a plurality of conductive lines on the substrate, wherein the plurality of conductive lines are electrically connected to the plurality of conductive portions, and one of the plurality of connecting pads is electrically connected to one of the plurality of conductive lines through one of the plurality of conductive portions, and wherein an insulating layer is disposed between the one of the plurality of connecting pads and the one of the plurality of conductive portions; and bonding a plurality of light emitting units to the plurality of connecting pads.

11. The methods for manufacturing the electronic device of claim 10, wherein the insulating layer has at least one via hole, and the one of the plurality of connecting pads is electrically connected to the one of the plurality of conductive portions through the at least one via hole.

12. The method for manufacturing the electronic device of claim 10, wherein the one of the plurality of conductive lines is a data line.

13. The method for manufacturing the electronic device of claim 10, wherein a portion of the one of the plurality of conductive lines is overlapped with at least one of the plurality of light emitting units.

14. The method for manufacturing the electronic device of claim 10, further comprising applying a bonding material on the plurality of the connecting pads.

15. The method for manufacturing the electronic device of claim 14, wherein the plurality of light emitting units are bonded to the plurality of connecting pads through the bonding material.

16. The method for manufacturing the electronic device of claim 10, wherein one of the plurality of connecting pads is directly connected to one of the plurality of conductive lines.

17. The method for manufacturing the electronic device of claim 16, wherein the one of the plurality of conductive lines is a data line.

* * * * *